United States Patent [19]

Arima et al.

[11] Patent Number: 4,866,493
[45] Date of Patent: Sep. 12, 1989

[54] SEMICONDUCTOR MEMORY DEVICE

[75] Inventors: Hideaki Arima; Kiyoteru Kobayashi, both of Hyogo, Japan

[73] Assignee: Mitsubishi Denki Kabushiki Kaisha, Tokyo, Japan

[21] Appl. No.: 191,762

[22] Filed: May 3, 1988

Related U.S. Application Data

[63] Continuation of Ser. No. 77,067, Jul. 23, 1987, abandoned, which is a continuation-in-part of Ser. No. 838,548, Mar. 11, 1986, abandoned.

[30] Foreign Application Priority Data

Mar. 13, 1985 [JP] Japan .................................. 60-51916

[51] Int. Cl.$^4$ ..................... H01L 29/78; H01L 49/02; H01L 27/02
[52] U.S. Cl. ........................................ 357/23.5; 357/6; 357/23.6; 357/23.14; 357/41; 357/51
[58] Field of Search ....................... 357/23.5, 54, 41, 6, 357/23.6, 23.14, 45, 51; 365/185

[56] References Cited

U.S. PATENT DOCUMENTS 4,251,829 2/1981 Adam .................................. 357/23.5
4,363,109 12/1982 Gardner, Jr. ...................... 357/23.5

FOREIGN PATENT DOCUMENTS 59-155967 9/1984 Japan .................................. 357/23.5

OTHER PUBLICATIONS

"Design Consideration for Scaling Flotox E$^2$PROM Cell", Jimmy Lee et al., *IEEE IEDM 83*, pp. 589–592, 1983.
"Reliablility, Aspects of a Floating Gate E$^2$ PROM", Bruce Euzent et al., IEEE/PROC. IRPS., pp. 11–16, 1981.
"An EEPROM for Microprocessors and Custom Logic", R. Cuppens et al., IEEE ISSCC Dig. Tech. Papers, pp. 268–269, Feb. 24, 1984.

*Primary Examiner*—Andrew J. James
*Assistant Examiner*—Ngan Van Ngo
*Attorney, Agent, or Firm*—Lowe, Price, LeBlanc, Becker & Shur

[57] ABSTRACT

A sense transistor of an EEPROM has a conductive diffusion layer which is isolated from the source-drain region of the sense transistor and newly formed on the surface of the semiconductor substrate beneath the floating gate of the sense transistor. The conductive diffusion layer is connected to the control gate of the sense transistor, whereby a capacitance between the control gate and the floating gate is increased without increasing the facing area of the control gate and the floating gate.

3 Claims, 5 Drawing Sheets

CELLS OF ONE BYTE

FIG.8B

SEMICONDUCTOR MEMORY DEVICE

This application is a continuation of application Ser. No. 077,067, filed July 23, 1987, abandoned, which is a continuation-in-part of application Ser. No. 838,548, filed Mar. 11, 1986, abandoned.

BACKGROUND OF THE INVENTION

1. Field of the Invention

The present invention relates to a semiconductor memory device. More specifically, the present invention relates to the structure of non-volatile memory cells permitting electrically writing and erasing information, which is referred as an electrically erasable and programmable read only memory (EEPROM).

2. Description of the Prior Art

Figure 1A:
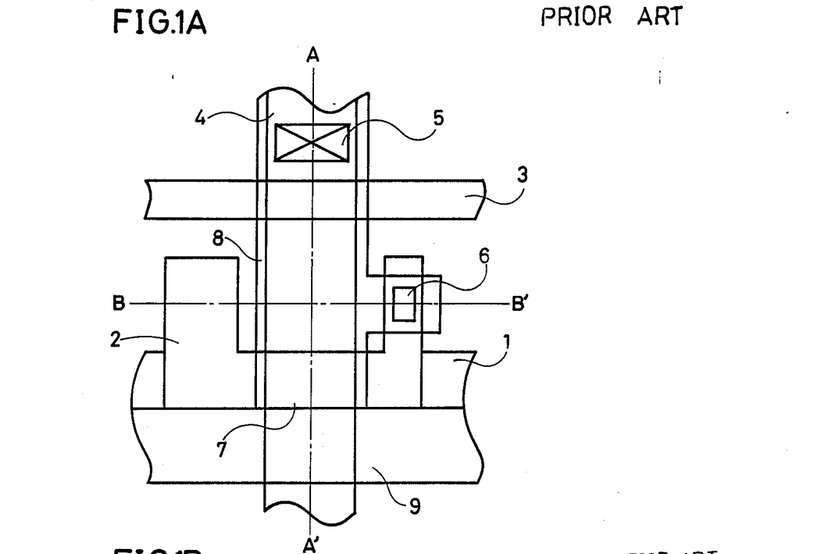
FIG. 1A shows a plan view depicting the configuration and arrangement of the memory cell of a conventional semiconductor memory device (EEPROM)
Figure 1B:
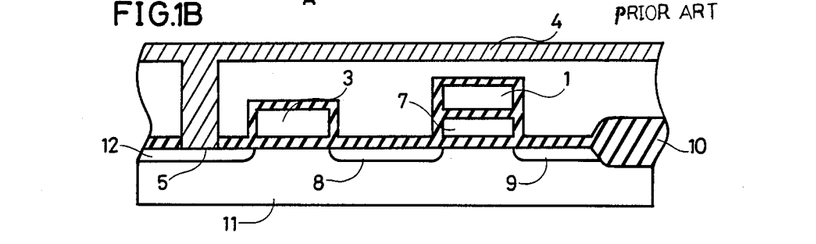
FIG. 1B is a cross sectional view taken along the line A-A' in FIG. 1A.
Figure 1C:
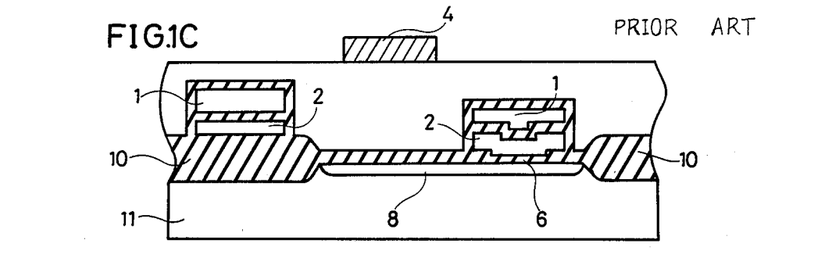
FIG. 1C is a cross sectional view taken along the line B-B' in FIG. 1A.

FIGS. 1A to 1C show the structure of an existing semiconductor memory of a floating-gate type. FIG. 1A is a plan view depicting the arrangement of the semiconductor memory cell, FIG. 1B shows a cross sectional structure taken along the line A-A' in FIG. 1A, and FIG. 1C shows a cross sectional structure taken along the line B-B'. The structure of the existing semiconductor memory cell, with reference to FIGS. 1A to 1C is described below.

The semiconductor memory cell comprises a sense transistor and a select transistor. Both transistors are provided on the main surface of a silicon semiconductor substrate 11.

The sense transistor comprises a drain region 8 and a source region 9 which are formed through diffusion of impurities on the main surface of the semiconductor substrate 11, a thin tunnel-oxide film 6 formed in a predetermined area on the drain region 8, a floating gate 2 made of polysilicon and formed through a dielectric film on the semiconductor substrate 11 at the area including at least the tunnel-oxide film 6, and a control gate 1 formed through a dielectric film on the floating gate 2. The control gate 1 and the floating gate 2 form a capacitor in the area where the two gates are overlapped with an insulating film (an interlayer insulating film) serving as a dielectric. With the tunnel-oxide film 6 serving as a dielectric, the floating gate 2 and the drain region 8 form a capacitor. In the area excluding the tunnel-oxide film 6, there exists a capacitance formed by the floating gate 2 and the semiconductor substrate 11, with the gate-oxide film 10 serving as a dielectric. The floating gate 2 stores electric charges and causes the emission or injection of electron charges from or into the drain region 8 through the tunnel-oxide film 6 as a function of the voltage applied between the control gate 1 and the drain region 8.

The select transistor comprises a source region 8 and a drain region 12 which are formed through diffusion of impurities onto the main surface of the semiconductor substrate 11 and the gate region 3 which receives a select signal. The drain region 12 is connected to an aluminium interconnection 4 through a contact hole 5. The aluminium interconnection 4 forms a bit line, while the gate region 3 forms a word line. In the following description the gate region 3 is described as a word line 3, while the aluminium interconnection 4 is described as a bit line 4.

According to the arrangement illustrated in FIGS. 1A and 1B, the sense transistor has a gate region 7, which is formed by the floating gate 2 in the region where no tunnel-oxide film 6 exits. In the gate region 7, as shown in FIG. 1A, the bit line 4, the control 1 and the floating gate 2 overlap each other through the respective dielectric films. The select transistor is either on or off in response to signals which are sent respectively through the word line 3 and the bit line 4 and then the transistor senses the information provided by the connected sense transistor. Further, it is electrically insulated from the adjacent cells by the cell isolation region 10 (a field oxide).

Figure 2:
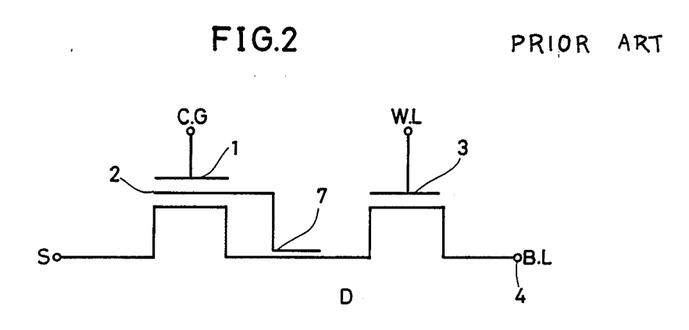
FIG. 2 is an equivalent circuit diagram of the memory cell of the conventional EEPROM.

FIG. 2 shows an equivalent circuit diagram of a semiconductor memory cell which is illustrated in FIG. 1A to 1C. As shown in FIG. 2, the drain of the sense transistor and the source of the select transistor are formed in the same diffusion layer 8 and connected to each other.

In the sense transistor, as described above, the control gate 1, the floating gate 2 and the semiconductor substrate 11 are formed through the respective dielectric layers. Thus, a capacitance is formed between them and a capacitance network is composed thereby.

Figure 3:
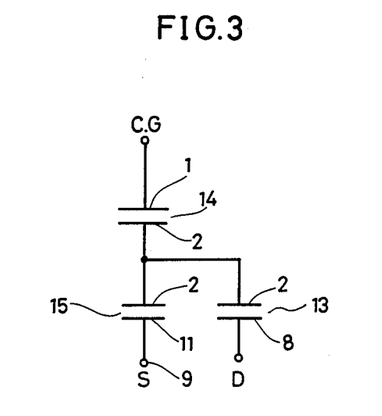
FIG. 3 is an equivalent circuit diagram of the capacitance network which is formed by the sense transistor included in the memory cell of the EEPROM.

FIG. 3 shows an equivalent circuit diagram of the capacitance network. As shown in FIG. 3, the capacitance network comprises a capacitance 14 composed of the control gate 1, the interlayer dielectric, and the floating gate 2; a capacitance 13 formed of the floating gate 2, the tunnel-oxide film, and the drain region 8; and a capacitance 15 formed between the floating gate 2 and the semiconductor substrate 11, minus the capacitance 12. The capacitances 13 and 15 are electrically connected in parallel and the capacitor 14 is electrically connected in series with those parallel connected capacitors (13 and 15). Now a description will be made of the operation with reference to FIGS. 1A to 1C, 2 and 3.

A memory cell of this floating-gate type stores information depending on the state of the excessive storage of electrons on the floating gate 2 or the state existence of the apparently positive electric charges due to electron insufficiency thereon. The operation of injecting electrons into the floating gate 2 is performed in the following manner. First a programming voltage $V_{PP}$ is applied to the word line 3 and the control gate 1. The source 9 of the sense transistor and the bit line 4 are set to a ground potential (0V). At this time an inversion layer is formed on the surface of the semiconductor substrate beneath the word line 3 and the potential of the drain region 8 of the sense transistor, i.e. the source region of the sense transistor, has the same ground potential (0V) as that of the bit line 4 through the drain 12 on the inversion layer and the select transistor, FIG. 4 shows an equivalent circuit diagram of the capacitance network implemented by a sense transistor in injecting electrons into the floating gate.

Figure 4:
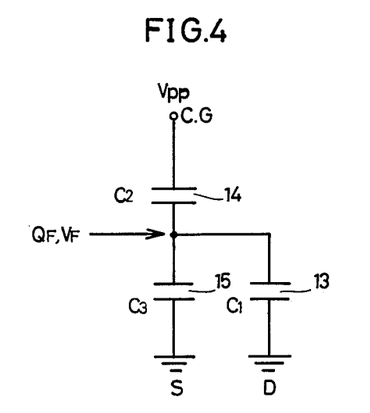
FIG. 4 is a equivalent circuit diagram of the capacitance network which is formed by the sense transistor when injecting electrons into the floating gate.

As shown in FIG. 4, the programming voltage $V_{PP}$ is applied to the control gate 1, and the source region 9 and the drain region 8 are grounded. At this time the semiconductor substrate 11 is normally grounded. $Q_F$ is the electric charge stored at the floating gate 2 and the voltage $V_F$ is a voltage to be applied to the capacitance 13, which is formed by the floating gate 2, the tunneloxide film 6 and the drain region 8.

Assuming that the capacitance value of the capacitance 13 is $C_1$, the capacitance value of the capacitance 14 is $C_2$, and the capacitance value of the capacitance 15 is $C_3$, then the voltage $V_F$ is expressed as follows:

$$V_F = (C_2 V_{PP} - Q_F)/C_T \tag{1}$$

where $C_T = C_1 + C_2 + C_3$.

The voltage $V_F$ expressed by the above described equation (1) is applied across the thin tunnel-oxide film 6. Thus a high electric field is applied and the electrons existing in the drain region 8 flow as a Fowler-Nordheim-type tunnel current through the 10 tunnel-oxide film 6 and they are stored in the floating gate 2.

On the other hand, then electrons are removed from the floating gate 2, the programming voltage $V_{PP}$ is applied to the word line 3 and the bit line 4, and the control gate 1 is used an a ground potential (0V). Further the source region 9 of the sense transistor is electrically placed in a floating state to keep the electrons from leaking.

In this state the select transistor is placed in a conduction state and the potential of the drain region 8, i.e. the source of the select transistor, in the sense transistor is approximately the same as the potential $V_{PP}$ of the bit line 4.

Figure 5:
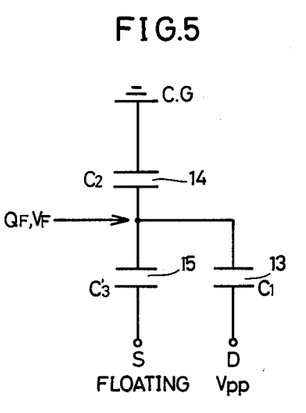
FIG. 5 is an equivalent circuit diagram of the capacitance network which is formed by the sense transistor when electrons from the floating gate are removed.

FIG. 5 shows an equivalent circuit diagram of the capacitance network which is implemented by a sense transistor in drawing electrons out of the floating gate. Since the semiconductor substrate 11 is grounded, as shown in FIG. 5, the source region 9 in an electrically floating state is also grounded through the semiconductor substrate 11. Further the drain region 8 is supplied with the programming voltage $V_{PP}$. Since the semiconductor substrate 11 is grounded, the junction capacitance formed between the drain region 8 and the substrate 11 contributes to the capacitance value of the capacitance 15. As a result, the capacitance becomes $C_3'$. However, a junction capacitance is as small as an amount nearly equal to the capacitance $C_3$ in case of electron injection operation. In this state, the voltage $V_F$ applied to the capacitance 13 is expressed as follows:

$$V_F = \{(C_2+C_3') V_{PP} - Q_F\}/(C_1+C_2+C_3') \quad (2)$$

Since the voltage $V_F$ in the above described equation (2) make a high electric field accross the tunnel-oxide film 6, electrons in the floating gate 2 flows into the drain region 8 as Fowler-Nordheim-type tunnel current through the tunnel-oxide film region 6. Thus, the electrons in the floating gate 2 are deficient.

When excessive electrons exist in the floating gate 2, the threshold voltage of the sense transistor increases and, as a result, the sense current through the select transistor decreases. To the contrary, when the electrons in the floating gate 2 are deficient, the threshold voltage of the sense transistor decreases and, as a result, the sense current through the select transistor increases. The magnitude of this current is stored in the form of the logics "0" and "1" of the digital information.

The voltage $V_F$ applied to the tunnel-oxide film 6 can be increased by increasing the capacitance value $C_2$ of the capacitance 14, as shown in the above described expression, provided that the programming voltage $V_{PP}$ is fixed. Higher voltage $V_F$ is not applicable because it causes the dielectric breakdown at the tunneling-oxide film 6. Contrarily, when lower voltage $V_F$ is applied, the tunnel current does not flow. In other words, an optimal value of the voltage $V_F$ exists Practically, the optimal value of the voltage $V_F$ is realized by proper selection of the values of the capacitance $C_2$ and the programming voltage $V_{PP}$.

The conventional semiconductor memory cells are structured as described above. In order to increase the capacitance $C_2$, therefore, it was necessary to enlarge the overlapping area of the floating gate 2 and the control gate 1, or to decrease the thickness of the interlayer dielectric film between the floating gate 2 and the control gate 1. When the thickness of the interlayer dielectric film between the control gate 1 and the floating gate 2 is decreased, the reliability of the memory is reduced. The reason will be described in the following. Since this interlayer dielectric film is generally formed through thermal oxidation of the polysilicon constituting the floating gate, the decreased thickness of the interlayer dielectric film causes concentrated effect of the electric field, which are caused by the irregularity of the polysilicon surface, and furthermore the retention property of stored electric charges is deteriorated, while the dielectric resistance is considerably reduced. When the overlapping area of the control gate 1 and the floating gate 2 is increased (instead of a decreased thickness of the interlayer dielectric field), the increase of the overlapping area runs counter to enhancement of the degree of integration of the semiconductor memory cells. Thus, the above described defects were involved in the conventional semiconductor memory devices.

The following are the references citable as the prior art of the interest to the present invention.

(1) Jimmy Lee and Vinod K. Dham, "Design Consideration for Scaling Flotox E$^2$PROM Cell", IEEE IEDM 83, pp. 589–592, 1983.

(2) Bruce Euzent et al., "Reliability, Aspects of a Floating Gate E$^2$PROM", IEEE/PROC. IRPS. pp. 11–16, 1981

(3) R. Cuppens et al., "An EEPROM for Microprocessors and Custom Logic", IEEE ISSCC Dig. Tech. Papers, pp. 268–269, February 24, 1984.

The above described Prior Art (1) discloses that the area of the tunnel-oxide should be considerably reduced in order to scale FLOTOX Cells without degrading the reliability.

The above described Prior Art (2) discusses the failure in mechanism of EEPROM for both erase and write cycling and data retention.

The above described Prior Art (3) reports that FLOTOX E$^2$PROM, with a signal polysilicon layer is accomplished by substituting a control gate with a diffusion layer.

SUMMARY OF THE INVENTION

An object of the present invention is to provide a semiconductor memory device with the above described defects removed and capable of increasing a capacitance value of a capacitance formed between the floating gate and the control gate, without increasing the overlapping area of the floating gate and the control gate and without reducing the thickness of the interlayer dielectric film.

The conventional semiconductor memory devices, as described above, had capacitances formed by utilizing the control gate and only the upper surface of the floating gate. In accordance with the semiconductor memory device of the present invention, however, the capacitance is formed by utilizing both the upper and lower surfaces of the floating gate. In other words, the conductive diffusion layer of impurities is formed on the surface of the semiconductor substrate beneath the floating gate, in a region different from the region that forms the sense transistor on the semiconductor substrate; the diffusion layer of the impurities is electrically insulated from the source and drain regions and electrically connected to the control gate.

Since the structure of this semiconductor memory device is as mentioned above, the capacitance between the control and floating gates becomes the sum of both the capacitance formed by the conventional floating and control gates and the capacitance formed by the floating gate and newly provided diffusion layer of impurities. Thus, the capacitance between the floating and control gates increases without increasing the facing area, as compared with that of the conventional semiconductor memory devices.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Now a description will be made of an embodiment of the present invention.

Figure 6A:
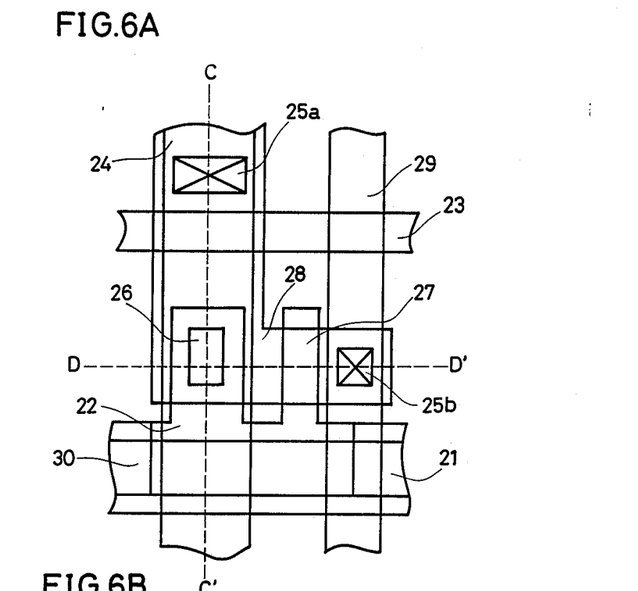
FIG. 6A shows the structure and arrangement of the EEPROM memory cell in an embodiment of the present invention.
Figure 6B:
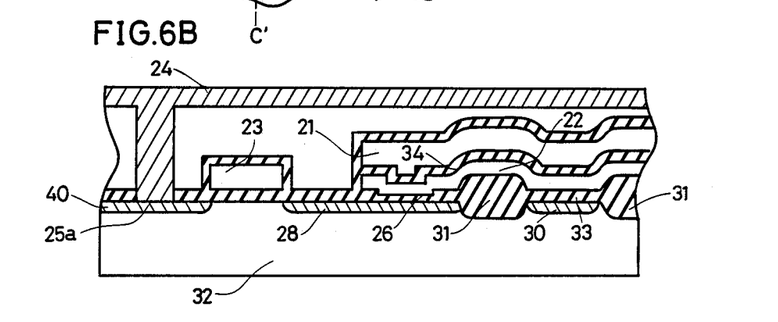
FIG. 6B is a cross sectional view taken along the line C-C' of FIG. 6A.
Figure 6C:
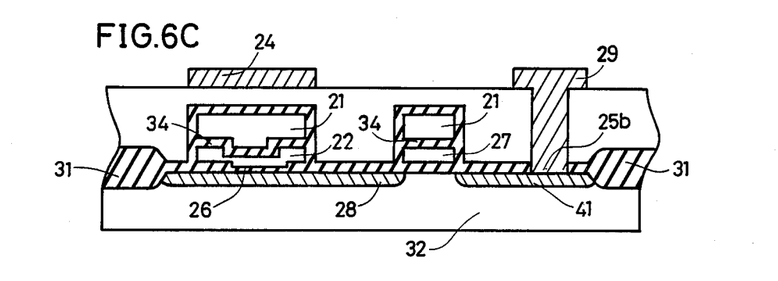
FIG. 6C is a cross sectional view taken along the line D-D' of FIG. 6A.

FIGS. 6A to 6C show an embodiment of the structure and arrangement of the semiconductor memory cell of the present invention. FIG. 6A shows a plan view of the embodiment of the arrangement of the semiconductor memory cell of the present invention. FIG. 6B shows a cross sectional view taken along the line C-C' in FIG. 1A. FIG. 6C shows a cross sectional view taken along the line D-D' in FIG. 1A. Now a description will be made of the embodiment of the semiconductor memory cell structure of the present invention with reference to FIGS. 6A to 6C.

The semiconductor memory cell comprise sense and select transistors which are formed on the major surface of the semiconductor substrate 32. The cells are electrically insulated from the adjacent semiconductor memories by a memory cell isolation region 31.

Figure 8A:
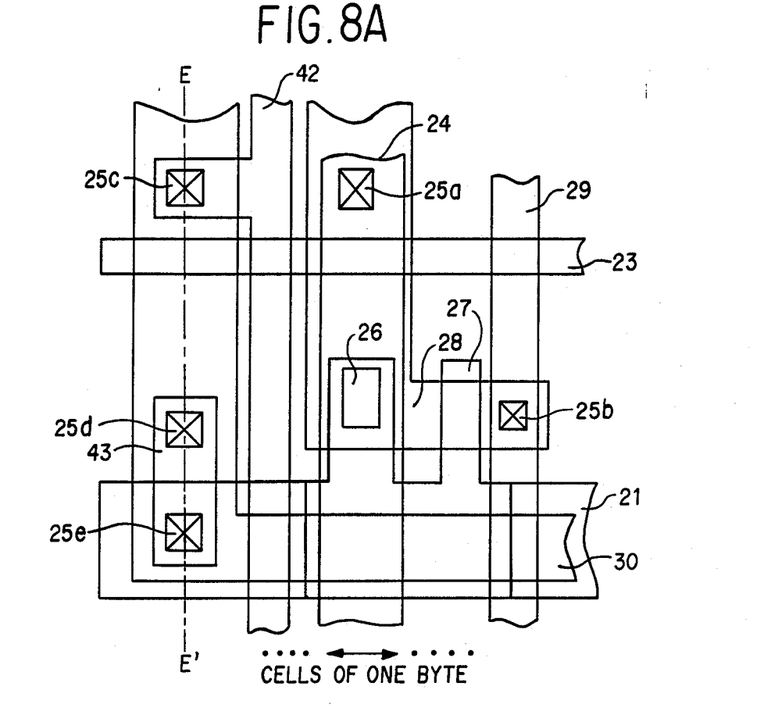
FIG. 8A is a plan view corresponding to FIG. 6A, expanded to show the connection of the control gate to the conductive fusion layer.

The sense transistor comprises a source region 41 and a drain region 28 which are formed by diffusion of impurities on the major surface of the semiconductor substrate 32; a floating gate 22 formed through a dielectric film on the semiconductor substrate 32, a control gate 21 formed through the dielectric film on the floating gate 22 and the conductive impurity diffusion region 30 which is newly formed to increase the capacitance between the control gate and the floating gate. The impurity diffusion region 30 is formed, for example, by the same manufacturing process step as is used for forming the source region 41 and the drain region 28. The dielectric film between the floating gate 22 and the semiconductor substrate 32 include a tunnel-oxide film region 26 and a gate oxide region. The floating gate 22 on the gate-oxide-film region comprises a gate region 27 in the sense transistor. Both the control gate 21 and the floating gate 22 are made of polysilicon. Further, the interlayer dielectric film between the control gate 21 and the floating gate 22 is produced by the thermal oxidation of polysilicon which forms the floating gate 22. On the other hand, the dielectric oxide film 33 between the floating gate 22 and the impurity diffusion layer 30, which is newly formed beneath the floating gate 22, is formed by the thermal oxidation of the conductive impurity diffusion layer 30. Further, the impurity diffusion layer 30 is electrically connected with the control gate 21, as shown in FIG. 8A and to be described in detail hereinafter. A source region 41 is connected to an aluminium interconnection 29 through a contact hole 25b. Further, the impurity diffusion layer 30, the source region 41 and the drain region 28 are electrically insulated by the cell isolation region 31. The control gate 21, the floating gate 22 and the impurity diffusion layer 30 have regions which overlap each other in a plan view, and prevent the cell occupied area from increasing with the new diffusion layer 30.

The select transistor is composed of a source region 28 which is used together with the sense transistor drain region 28, a drain region 40 which is connected through the contact hole 25a to the aluminium interconnection (bit line) 24 and a gate region (word line) 23. The dielectric film is formed between the semiconductor substrate 32 and the word line 23.

Figure 7:
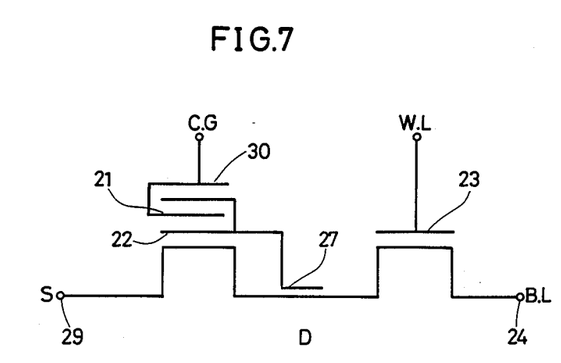
FIG. 7 is an equivalent circuit diagram of the EEPROM memory cell of the present invention.

FIG. 7 shows an equivalent circuit diagram of the embodiment of the semiconductor memory of the present invention. The drain region of the sense transistor and the source region of the select transistor have a common region 28 and are connected thereto. Furthermore, as a characteristic of the present invention, the newly established diffusion layer 30 is electrically connected with the control gate. Thus, the capacitance formed between the control gate 21 and the floating gate 22 is a sum of the capacitance formed at the control gate 21-interlayer dielectric film 34 - the floating gate 22, and the capacitance formed at the diffusion layer 30-dielectric film 33 - the floating gate 22.

The capacitance between the semiconductor substrate 32 and the control gate 21 in the semiconductor memory device in accordance with an embodiment of the present invention is approximately expressed by the capacitance network shown in FIG. 3. However, as a feature of the present invention, the capacitance value of the capacitance between the control gate 21 and the floating gate 22 is greater than that in the conventional ones.

Figure 8B:
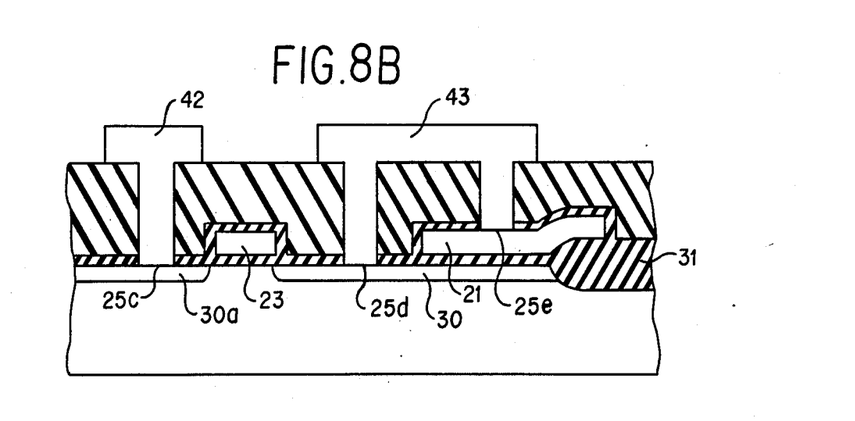
FIG. 8B is a cross-sectional view taken along the line E-E' in FIG. 8A.

The layout of a memory produced in accordance with the invention is now described more clearly with reference to FIGS. 8A and 8B. In FIGS. 8A and 8B, the conductive diffusion layer 21 is located parallel with the control gate 21. The conductive diffusion layer 30 is shared with one-byte memory cells along the horizontal line in FIG. 8A. The diffusion layer 30 extends to the word line 23. The additional diffusion layer 30a, the word line 23 and the conductive diffusion layer 30 construct an MOS transistor. An aluminum interconnection 42 runs crossing the word line 23, the control gate 21 and the diffusion layer 30. The aluminum interconnection 42 is connected to the additional diffusion layer 30a through the contact hole 25c. The control gate 21 is electrically connected to the diffusion layer 30 by an aluminum interconnection 43 through the contact holes 25d and 25e. The contact holes 25c, 25d and 25e are formed simultaneously with the contact holes 25a and 25b. Aluminum interconnections 42 and 43 are formed simultaneously with the aluminum interconnections 24 and 29.

In the above construction, when the word line 23 is selected to be boosted up to a programming pulse $V_{pp}$, the aluminum interconnection 42 is simultaneously set at the programming voltage $V_{pp}$. As a result, the transistor formed of the additional diffusion layer 30a, the word line 23 and the conductive diffusion layer 39 turns on to transfer the programming voltage $V_{pp}$ to the conductive diffusion layer 30 and the control gate 21 shared with one-byte memory cells. When the word line 23 is not selected to be at ground potential, the transistor remains off and therefore the control gate 21 and the conductive diffusion layer 30 are at ground potential.

As described above, according to the present invention, the layout of locating the conductive diffusion layer 30 and the control gate 21 in parallel makes the memory highly integrated and highly reliable without any modification to the conventional fabricating processes and any additional processes.

Now description will be made of the operation of the semiconductor memory device in accordance with the embodiment of the present invention with reference to FIGS. 6A to 6C and 7 as well as 3. First, description will be made of the operation of injecting electrons into the floating gate 22. At this time the programming voltage $V_{PP}$ is applied to the control gate 21, the diffusion layer 30 and the word line 23, and the grounding occurs at the aluminium interconnection 29 connected to the source 41 of the sense transistor and the bit line 24. The equivalent circuit diagram in a state of voltage application at this time is shown in FIG. 4. According to the equivalent circuit diagram, it is possible to analyze the voltage between the respective capacitances. In other words, the voltage $V_F$ applied across the tunnel-oxide film 26 is approximately expressed by the following equation:

$$V_F = (C_2 V_{PP} - Q_F)/C_T \quad (3)$$

where $C_F = C_1 + C_2 + C_3$.

The capacitance value of the capacitance $C_2$ is a sum of the capacitance values of the capacitance formed at the overlapping between the control gate 21 and the floating gate 22, and the capacitance value of the capacitance formed between the floating gate 22 and the diffusion layer 30. The oxide film 33 between the floating gate 22 and the diffusion layer 30 is formed through thermal oxidation on the surface of the diffusion layer 30. Therefore, the dielectric strength is approximately 10 MV/cm. On the other hand, the interlayer oxide film 34 between the control gate 21 and the floating gate 22 is formed through thermal oxidation of the polysilicon which forms the floating gate 22. Therefore, the dielectric strength is approximately 4 MV/cm. Even if the thickness of the interlayer oxide film 33 is approximately a half of the thickness of the interlayer oxide film 34, the dielectric breakdown cannot occur while injecting electrons into the floating gate 22. Generally, the following, equation is obtained from the capacitance C, the thickness T of the dielectric film and the areas:

$$C = \epsilon_{0x} S/T_{0x} \ldots$$

where $\epsilon_{0x}$ is permitivity of the dielectric film. Thus, it is possible to form a capacitance between the diffusion layer 30 and the floating gate 22 with the same value as that of the capacitance formed between the control gate 21 and the floating gate 22, by selecting the thickness of the oxide film 33 to be a half of the thickness of the interlayer oxide film 34, even if the overlapped area of the diffusion layer 30 and the floating gate 22 is still a half of the overlapped area of the control gate 21 and the floating gate 22. As a result, it is possible to increase the capacitance value of the capacitance $C_2$ between the control gate 21 and the floating gate 22 as much as two times the conventional semiconductor memories. In this way, it is possible to increase the capacitance value of the capacitance $C_2$ to be greater than that of in the conventional semiconductor memories, in accordance with when the semiconductor memory of the present invention provided with the diffusion layer beneath the floating gate 20, even if the overlapped area of the control gate 21 and the floating gate 22 is the same as that in the conventional semiconductor memories. When the capacitance value of the capacitance $C_2$ is increased, the voltage $V_F$ applied to the tunnel-oxide film 6 increases to be larger than that in the conventional semiconductor memories, with. a predetermined programming voltage VPP applied in accordance with the equation (3). Contrarily, it is also possible to decrease the value of the programming voltage $V_{PP}$ necessary to obtain a predetermined voltage $V_F$ On the other hand, FIG. 5 shows an equivalent circuit diagram at the time when the electrons are removed from the floating gate 22. The voltage $V_F$ to be applied across the tunnel-oxide film 6 is approximately shown by the following equation:

$$pti\ V_F = \{(C_2 + C_3')V_{PP} - Q_F\}/C'_T \quad (4)$$

where $C'_T = C_1 + C_2 + C_3'$.

Even if a predetermined programming voltage $V_{PP}$ is applied on the basis of the above described equation (4), in the same manner as is used in injecting electrons, the voltage $V_{PP}$ applied to the tunnel-oxide film increases and, conversely, it is possible to reduce the value of the programming voltage $V_{PP}$ for applying the voltage $V_F$ of a predetermined value to a value lower than that in the conventional semiconductor memories. When the value of the programming voltage $V_{PP}$ is reduced, it becomes possible to increase the transistor design allowance to implement a semiconductor device of this type and to enhance reliability and integration.

In the above described embodiment, the thermal oxide film is used as a dielectric film which forms a capacitance surrounding the floating gate 22. However, any dielectric film can be used, if its electrical characteristics, such as dielectric strength and change retention, satisfy the requirements for EEPROM.

The arrangement of the respective parts, constituting a semiconductor memory cell, is not restricted to those shown in FIGS. 6A to 6C. Therefore, an optional arrangement can be made, insofar as it satisfies the equivalent circuit diagram, as shown in FIG. 7.

According to the present invention, as described above, it is possible to use both the upper and lower surfaces of the floating gate to form the capacitance, by fabricating the diffusion impurity layer on the surface of the semiconductor substrate beneath the floating gate to clip a floating gate with the diffusion layer and the control gate through the respective dielectric films. Thus, it is possible to enlarge the capacitance formed between the floating gate and the control gate, without increasing the overlapping area of the floating and control gates. As a result, it is possible to reduce the value of the programming voltage necessary to apply a required voltage to the tunnel-oxide film, as compared with the value of the programming voltage in the conventional semiconductor memory devices. Therefore, it is possible to enhance the reliability and integration of the EEPROM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having source and drain regions formed on the surface of a semiconductor substrate, a floating gate for storing the electric charges formed on said semiconductor substrate through a first dielectric layer, a control gate for receiving a control signal for controlling the out-flow or in-flow of the electric charges stored in said floating gate formed on said floating gate through a second dielectric layer, and word lines and bit lines intersecting at memory cells of said memory device, comprising:

a conductive diffusion region of impurities located beneath said floating gate and formed on the surface of said semiconductor substrate in a region different from said source and drain regions said conductive diffusion region forming a capacitance with said floating gate, said conductive diffusion region of impurities being electrically connected to said control gate, said control gate and diffusion region being elongated, said diffusion region and said control gate overlapping and having longitudinal axis parallel to each other in a region underlying said bit line, said diffusion region coupled to a number of memory cells which together form at least one-byte memory cells, a portion of said floating gate extending over said drain forming a tunnel-oxide area through said first dielectric layer, said control gate and one of said bit lines overlapping each other at said tunnel-oxide area.

2. A semiconductor memory device in accordance with claim 1, wherein an overlapping region exists between said conductive diffusion regions, said floating gate, and said control gate.

3. The device of claim 1, wherein said floating gate, control gate, and said source and drain regions comprise a floating gate transistor that couples together the word line and said conductive diffusion region at each said memory cell which cells together form said at least one-byte memory cells.

* * * * *